United States Patent [19]

Thakoor et al.

[11] Patent Number: 4,969,021

[45] Date of Patent: Nov. 6, 1990

[54] POROUS FLOATING GATE VERTICAL MOSFET DEVICE WITH PROGRAMMABLE ANALOG MEMORY

[75] Inventors: Anilkumar P. Thakoor; Alexander W. Moopenn, both of Pasadena, Calif.; John J. Lambe, Redmond, Wash.

[73] Assignee: California Institute of Technology, Pasadena, Calif.

[21] Appl. No.: 364,114

[22] Filed: Jun. 12, 1989

[51] Int. Cl.$^5$ .............................. H01L 29/78
[52] U.S. Cl. ............................ 357/23.5; 357/2; 357/4; 357/6; 357/23.1
[58] Field of Search ................ 357/5, 23.1, 45, 2, 357/4, 23.7, 23.4, 6, 23.5

[56] References Cited

U.S. PATENT DOCUMENTS

| | | | |
|---|---|---|---|
| 3,588,638 | 12/1971 | Fleming | 357/2 |
| 3,755,026 | 8/1973 | Reynolds | 357/6 |
| 3,972,059 | 7/1976 | DiStefano | 357/6 |
| 3,988,720 | 10/1976 | Ovshinsky | 357/2 |
| 4,228,524 | 10/1980 | Neale et al. | 357/2 |
| 4,272,562 | 6/1981 | Wood | 357/2 |
| 4,485,389 | 11/1984 | Ovshinsky et al. | 357/2 |
| 4,597,162 | 7/1986 | Johnson et al. | 357/2 |
| 4,660,166 | 4/1987 | Hopfield | 364/807 |
| 4,720,736 | 1/1988 | Takafuji et al. | 357/2 |
| 4,740,908 | 4/1988 | Berger et al. | 364/829 |
| 4,760,437 | 7/1988 | Lenker et al. | 357/30 |
| 4,876,668 | 10/1989 | Thakoor et al. | 357/2 |

FOREIGN PATENT DOCUMENTS

| | | | |
|---|---|---|---|
| 0296030 | 12/1988 | European Pat. Off. | 357/23.5 |
| 62-115775 | 5/1987 | Japan | 357/23.4 |

OTHER PUBLICATIONS

S. M. Sze, Physics of Semiconductor Devices, 2nd Ed., John Wiley and Sons, 1981, pp. 496–506.
J. P. Sage et al., "An Artificial Neural Network Integrated Circuit Based on MNOS?CCD Principles," Neural Networkd for Computing, AIP Conference Proceedings 151, Am. Inst. of Phys., New York, 1986, pp. 381–385.

*Primary Examiner*—Rolf Hille
*Assistant Examiner*—Steven Loke
*Attorney, Agent, or Firm*—Antonio M. Fernandez

[57] ABSTRACT

An electrically programmable, erasable, read-only memory is comprised of an array of vertical porous floating gate MOSFET structures in a layer of a-Si with parallel X and parallel Y conductors on opposite sides of the a-Si layer functioning as source and drain electrodes. The floating gate of each vertical MOSFET structure consists of a plurality of electrically insulated metallic particles embedded in the a-Si layer between said source and said drain electrodes with the metallic particles adjacent to the source electrodes. The insulation between the metallic particles and the a-Si material is thick enough to prevent tunneling of electrons but the insulation between the particles and the source electrode is thinner to allow tunneling of electrons at a predetermined threshold voltage to store a charge in the porous floating gate. Alternatively, the metal particles may be gathered into one insulated toroidal gate which controls current through a-Si in the center of the toroidal gate. Analog or binary information may be stored in the vertical MOSFET structures by application of high voltage. Stored information may be read without erasing the stored information by application of a low voltage, and information may be erased by application of a high reverse voltage.

7 Claims, 4 Drawing Sheets

POROUS FLOATING GATE VERTICAL MOSFET DEVICE WITH PROGRAMMABLE ANALOG MEMORY

Origin of the Invention

The invention described herein was made in the performance of work under a NASA contract, and is subject to the provisions of Public Law 96-517 (35 USC 202) in which the Contractor has elected to retain title.

Technical Field

The invention relates to a thin film random access memory matrix, and more particularly to an ultra high density memory comprised of nonvolatile memory elements with "read-only" capability that are electrically analog programmable and erasable.

Background Art

Massive parallel information processing in electronic neural networks relies heavily on variable connection strengths for "weights" among the synaptic inputs to dendrites of neurons (operational amplifiers) that produce electrical signals. The signals propagate through axons to other neurons of the network. The very large number of synapse connections store the vast amount of information, as well as the rules of processing designed into the neural network connections by their weights.

MOSFET structures have been proposed for use as conventional electrically-programmable read-only memory (EPROM) devices and electrically erasable and programmable EEPROM devices in integrated circuits, as reported by S. M. Sze in *Physics of Semiconductor Devices* (2nd Ed.) John Wiley & Sons (1981) at pages 496–506. However, the structure of such devices in very large scale integrated (VLSI) circuits significantly restricts the overall size of neural networks. Consequently, no large scale, high density neural networks have been known to be built with such planar MOSFET devices due to such complexities. Furthermore, conventional EPROM or EEPROM devices do not provide analog memory, which is a most important requirement of neural architectures in order to provide synaptic weights in neural networks as disclosed by John J. Hopfield in U.S. Pat. No. 4,660,166. However, currently there are efforts underway to develop analog EPROM/EEPROM devices for such applications, but these devices are still too complex for high density implementations due to their three-terminal configurations.

In the prior-art MOSFET devices proposed for EPROM applications as reported by Sze, the device is fabricated in a conventional way by diffusion of p+ contact regions for the source and drain through one surface of an n-type substrate and depositing a metal gate over an insulating film across the gap between the p+ regions. However, instead of making an ohmic contact with the gate, an outer insulating film is deposited over the gate, and an external metal gate is deposited over the outer insulating film. Upon application of a positive voltage on the external gate, a charge is stored in the internal floating gate due to current tunneling through the outer insulating film during the application of the gate voltage, and an electric field is established in the inner insulating film to control current through the semiconductor channel between the source and drain. Reversing the polarity of the high gate voltage erases the stored charge.

An object of this invention is to simplify the structure of the floating gate MOSFET for use in a very large and dense synaptic plane, i.e., for implementation of a large, high density synaptic memory array. A further object is to provide analog memory in such a floating gate MOSFET for use in such applications as neural networks.

Statement of the Invention

In accordance with the present invention, an electrically programmable, erasable, read-only, analog memory is provided by an array of vertical metal-oxide-silicon field-effect transistor (MOSFET) structures comprised of a first array (X) of conductors on one side of an amorphous semiconductor chip, a second array (Y) of conductors on the other side of the chip, and an insulated "porous" floating gate between metal conductors (source and drain electrodes) at each crossing of X and Y conductors which may be used in addressing each memory element for writing, reading and erasing the data stored.

The porous floating gate of each MOSFET consists of particles (minute segments) of electrically insulated metal, embedded within the semiconductor, with one insulated surface separated from a source electrode only by the insulator which serves as a tunneling barrier so as to effectively form one "porous" floating gate resting against, but insulated from, the source electrode. Thus, the insulated metallic segments within the semiconductor volume defined by a set of crossing of X and Y conductors form a collective, distributed porous floating gate for a vertical MOSFET structure. That floating gate is said to be "porous" because spaces between insulated metal particles are filled with semiconductor material for conduction of electrons from a source electrode (X conductor) to a drain electrode (Y conductor) while the floating gate is storing a charge. The current conducted is thus dictated by the charge stored.

Through selective application of voltage signals above a predetermined threshold to the X and Y conductors, the porous floating gates of the MOSFETs may be selectively charged, whereas the charge is retained by the floating gates during read-out operations carried out at a read voltage lower than the threshold of the same polarity. The pattern of stored charges (i.e., the data stored) may be selectively erased by applying a large voltage of opposite polarity to the appropriate X and Y conductors.

The novel features that are considered characteristic of this invention are set forth with particularity in the appended claims. The invention will best be understood from the following description when read in connection with the accompanying drawings.

Brief Description of the Drawings

FIG. 2b is a cross section taken along a line 2b–2b of FIG. 2a.

Detailed Description of the Invention

Figure 1A:
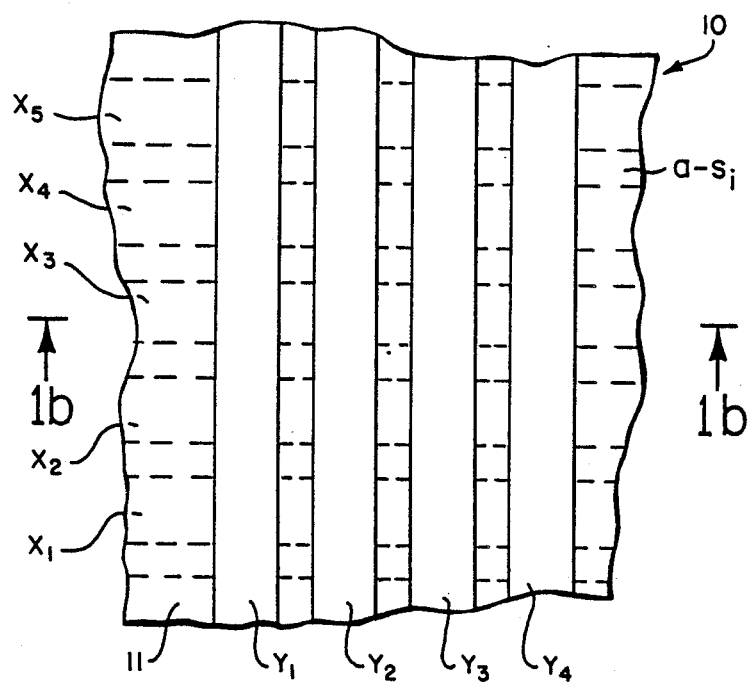
FIG. 1a is a plan view of a portion of a thin film access memory matrix embodying the present invention.
Figure 1B:
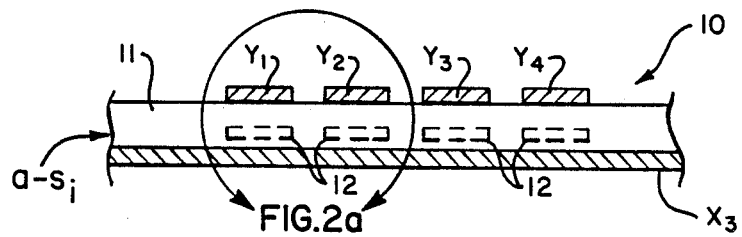
FIG. 1b is a cross section taken on a line 1b–1b in FIG. 1a showing "porous" insulated floating gates between an X conductor and a plurality of orthogonal Y conductors.
Figure 2A:
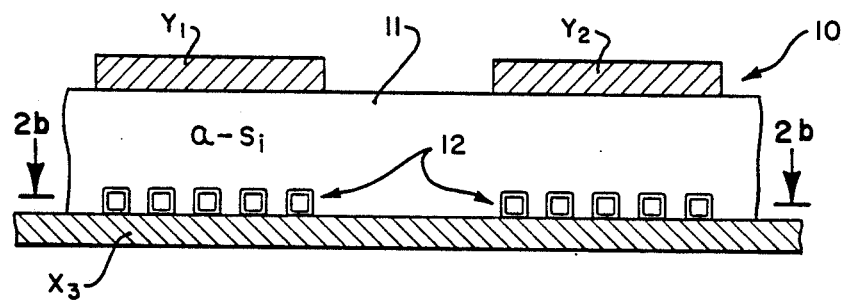
FIG. 2a is a cross section of a portion of FIG. 1b enlarged to show porous floating gates of two adjacent memory cells.
Figure 2B:
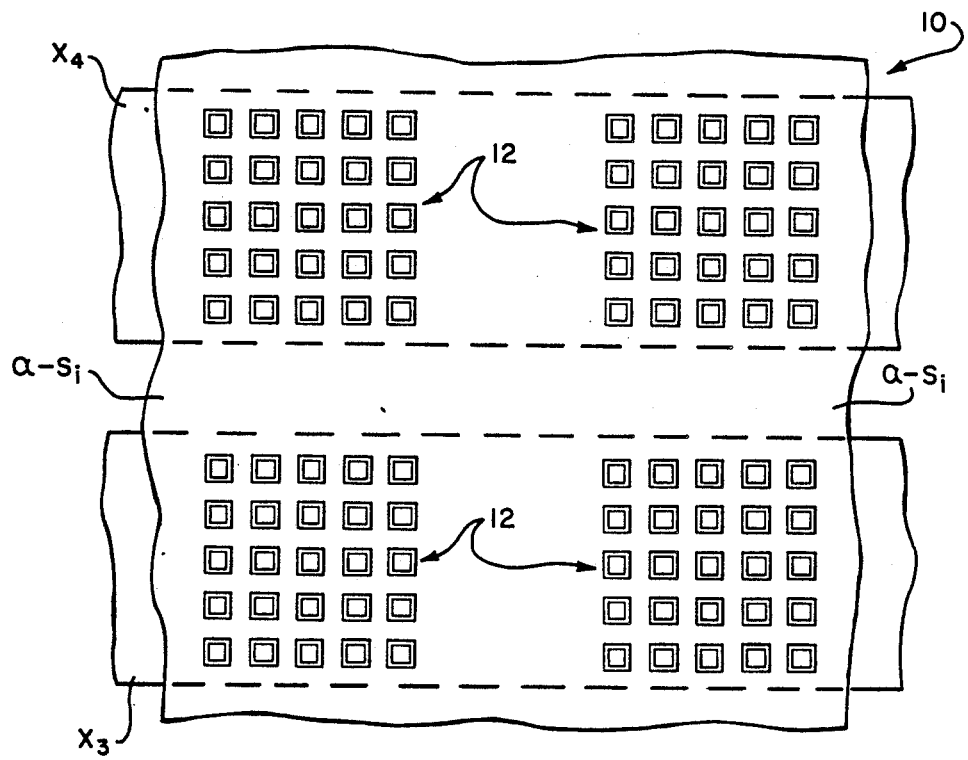
Figure 3A:
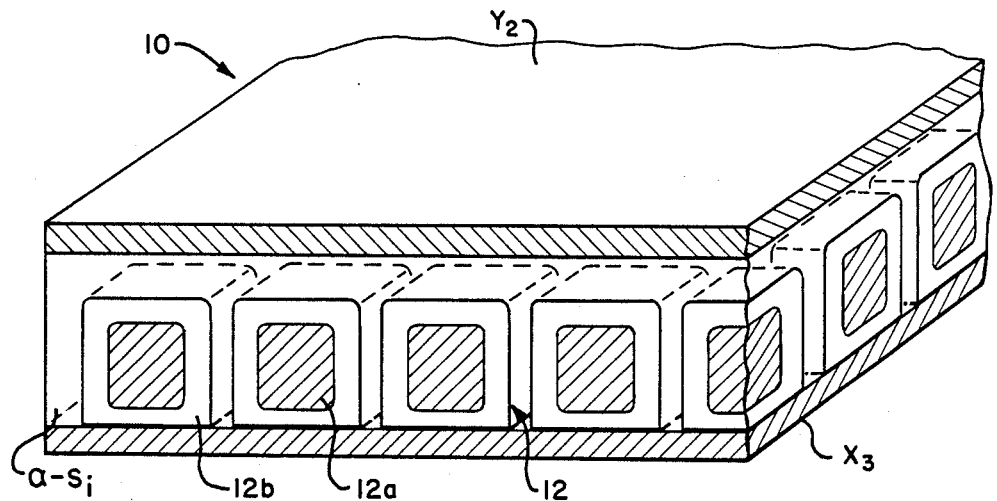
FIG. 3a is an isometric view of one memory cell at a crossing between X and Y conductors in the array of FIG. 1a through FIG. 2b.
Figure 3B:
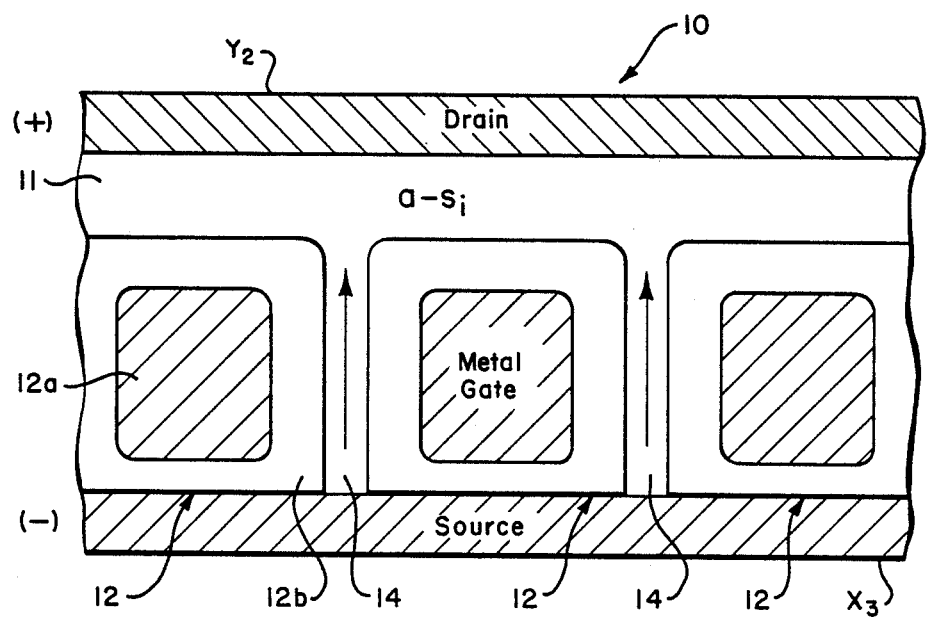
FIG. 3b is a cross section of a smaller portion of the cell shown in FIG. 3a enlarged.

Referring to the drawings, FIGS. 1a, 1b, 2a and 2b illustrate an array 10 of two-terminal, electronically programmable, erasable analog memory elements comprised of vertical metal-oxide-silicon field-effect transistor (MOSFET) structures, which are based upon the novel concept of a floating "porous" gate fabricated of insulated metallic particles or segments embedded in a semiconductor layer 11, such as intrinsic amorphous silicon, between X and Y conductors for each element. The X and Y conductors are shown laid out as parallel arrays with the X conductors oriented perpendicular to the Y conductors, which is not a requirement, but for maximum density of memory elements in the memory plane, the array of X conductors should be parallel and oriented perpendicularly to the parallel array of Y conductors. FIGS. 3a and 3b illustrate a portion of one memory element in the array 10 which may be expanded to an array of any size desired.

The active portion of each of the memory elements in the matrix array 10 in FIGS. 1a and 1b is completely enclosed within a volume of amorphous silicon contained between orthogonal X and Y thin film metallic conductors provided in a conventional manner as is well known for metallization of any integrated circuit. The X conductors are labeled $X_1$, $X_2$, $X_3$ and the Y conductors are labeled $Y_1$, $Y_2$, $Y_3$ . . . to facilitate identifying (addressing) any one memory element in the array. Thus, at the unique position between the crossover of each pair of X and Y conductors, such as $X_3$ and $Y_1$ or $Y_2$ as shown in FIG. 2a, there is a floating, porous metal gate 12 comprised of deposited particles or segments of metal 12a, such as magnesium, each surrounded by a film 12b of insulation, such as $MgO_2$. These insulated metal particles are embedded in the layer 11 of amorphous silicon with one insulated side directly over the conductor $X_3$, as shown in FIGS. 3a and 3b. The conductors on opposite sides of the amorphous silicon chip are spaced sufficiently far apart on each side to avoid mutual interaction between storage elements. Thus, it is expected that an array of very dense elements can be achieved without thermal problems because, as will be fully appreciated from the following description, the array requires very low power for operation.

FIG. 3b is a schematic cross-sectional view of the element shown in FIG. 3a drawn to a larger scale. The single memory element between conductors $X_3$ and $Y_2$ constitutes a vertical metal-oxide-silicon field-effect transistor (MOSFET) with a porous floating gate. The source and drain electrodes of the transistor are the conductors $X_3$ and $Y_2$. The vertical channels 14 between the metal gate particles 12a are filled with amorphous silicon. In that manner, a porous gate comprised of metallic particles 12a covered with insulating material 12b on all sides is buried in the amorphous silicon. The insulating material on the bottom of the particles 12a is thinner than on the sides and top, and makes direct contact with the source conductor $X_3$. The thinner insulation between the X conductors and the metallic particles of the porous floating gate acts as a tunneling barrier for charging and retaining a charge in the floating gate, while the amorphous silicon between the insulated metallic particles acts as a conducting channel for the vertical MOSFET structure during read out. The insulated metallic particles within the volume of active amorphous silicon defined by the crossover of conductors $X_3$ and $Y_2$ thus form a collective porous floating gate for a single MOSFET in the array.

This array of vertical MOSFET structures may be formed, for example, by using plasma assisted chemical vapor deposition, sputtering, or thermal evaporation of the various layers in the proper sequence. The insulating material can be an oxide chemically formed on the X conductors, or the metal from which the X conductors are later etched, such as nickel or other refractory metal 1000 Å to 500 Å thick and 0.5 $\mu$ to 2 $\mu$ wide with 0.5 $\mu$ to 2 $\mu$spacing. Then the insulating material that is to be between the source electrode and the floating porous gate may be etched until it has been reduced to the thickness desired for its function as a tunneling barrier, i.e., until it allows tunneling of electrons due to an applied voltage greater than a predetermined threshold voltage. Following this, metallic particles a few hundred Angstroms in size are deposited for the floating gate.

The metal particles do not have to be geometrically well placed; they may be randomly distributed and of random size. The natural result of the distribution of particles in size and position would be suitable, and would be formed by self-coalescence when the deposited metallic film is very thin, (like randomly distributed islands). The insulated floating porous gates thus formed are not intended to conduct current but simply to receive and store electrons, i.e., to store an electrostatic charge. Alternatively, the lithographic deposition techniques known in the art may also be used with sufficient accuracy for the position and size of a set of particles to form the floating gates.

A preferred method of fabrication using photolithographic techniques begins with depositing and patterning a metal layer on an insulating substrate (glass or oxidized silicon wafer) to form the source electrodes. Next, a thin insulating layer serving as a tunneling barrier is deposited on the surface of the source electrode. The insulating layer may be formed by thermal or plasma oxidization of the electrode of by chemical/physical vapor depositions. A discontinuous metal film is then deposited to form the floating metal gates. The gates consist of particles or segments (islands) of metal randomly distributed in size and position as nucleating sites develop and grow naturally. The deposition process may be sputtering or thermal evaporation. The metal gates are then oxidized in an oxygen ambient to form an insulating surface. Metals which can easily be deposited as discontinuous film and readily oxidized, such as magnesium, are preferred. An alternative method of forming the metal particle gates makes use of electron beam lithography. This method does not require the gate metal film to be discontinuous as deposited; the gates are first deposited as a continuous metal film. Then a photoresist mask patterned by electron lithograph is used to define the individual gates, and particles in each gate, by etching.

Separated porous floating gates may be formed for the array of MOSFET structures shown in the figures by etching away deposited metallic particles that are not within an area defined by crossing X and Y conductors. However, since the metal particles or segments are oxidized to form an electrically insulating film over each particle, there is no requirement for the gates to be separated.

Next the oxide on the source electrode between the gate particles is etched sufficiently to open up channels that are to receive amorphous silicon. Then the amorphous silicon is grown over and between the floating gate particles by a conventional technique, such as RF glow-discharge decomposition of silane. And finally the second array (X) of conductors is deposited and patterned.

As noted hereinbefore, the volume of amorphous silicon and floating gate particles between crossing X and Y conductors constitute the active portions of the memory elements. The metal particles outside that volume (if not etched away) are not charged during the write mode of operation, and therefore effectively allow the amorphous silicon around them to continue to present high resistance to the flow of current during a read mode of operation.

Figure 4:
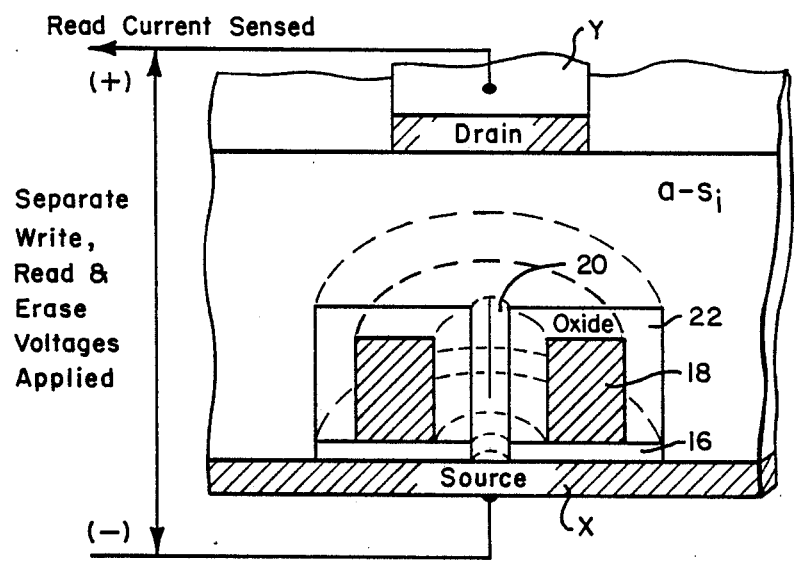
FIG. 4 illustrates schematically the vertical channel between a "porous" floating gate now shaped as an insulated toroid.

As noted above, the thin insulating film between an X conductor (source electrode) and a porous floating gate acts as a tunneling barrier shown in a variation of the present invention at 16 in FIG. 4 where the porous floating gate 18 is illustrated as having a toroidal shape insulated from a central amorphous silicon channel 20 by an oxide film 22. At a sufficiently high voltage applied across the source and drain electrodes, X and Y conductors, electrons can tunnel through the barrier 16 to charge the gate. That high voltage used to charge the gate is the programming or 'write' voltage. When the programming voltage is removed, the floating gate retains its charge. The charge retentivity during read out at a lower voltage of the same polarity depends heavily on the quality of the tunneling barrier 16 between the source electrode and the floating gate.

Figure 5:
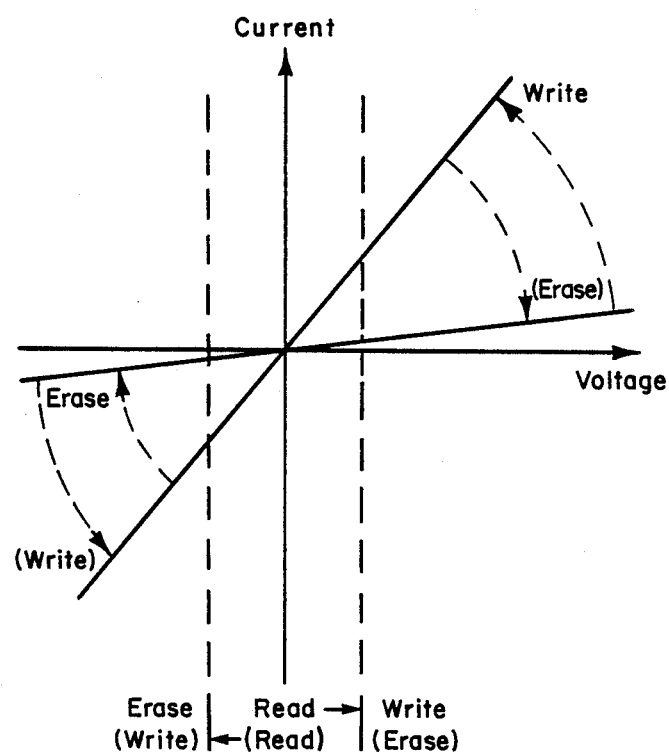
FIG. 5 is a graph of the current-voltage characteristic of the memory elements of this invention showing the 'write,' 'read' and 'erase' regions of voltage applied across the X and Y conductors.

The conductivity of the vertical channel of amorphous silicon between segments of the porous floating gate as shown in FIG. 3b, or the center of a toroidal floating gate as shown in FIG. 4, is dependent on the stored charge. The stored charge in the gate can be varied by applying an appropriate programming voltage between the source and drain electrodes to allow electrons to tunnel in or out of the floating gate. For example, electrons can tunnel from the source into the floating gate by applying a sufficiently large negative voltage to the source with respect to the drain. Similarly, the electrons can tunnel from the floating gates to the source by reversing the polarity. The programming threshold voltages can be tailored by the thickness of the tunneling insulator to minimize 'read' disturbance. When a 'read' voltage is much lower than the programming threshold voltage, the current between the source and drain is approximately proportional to the voltage and the stored charge as shown in FIG. 5. For 'read' voltages sufficiently less than the threshold voltage, there will be negligible effect on the stored charge in the floating gate during the 'read' operation.

In operation of an array of vertical MOSFET memory elements provided in accordance with the present invention, a charge is stored in floating gates of only selected memory elements, and the charge may be controlled by the magnitude, polarity and duration of the write/erase (programming) voltage. In the absence of any charge stored in the floating gate of an element, the source-to-drain path through the amorphous silicon channel will have maximum resistance to conduction in the read region of the I–V characteristics for the device shown in FIG. 5. The distributed gate particles separated from the source conductor form a capacitor that may store a positive charge. The stored positive charge will attract electrons to the regions under and around the gate particles to cause the channel between particles to conduct a current proportional to the charge. This phenomena is analogous to an enhancement-mode MOSFET in which the channel conductance is normally very low. A positive charge must be stored in the gate to increase conduction and, for a given source-drain voltage, the greater the positive charge stored in the gate, the greater the channel current for a given source-drain voltage.

Reversing the source-drain voltage within the limited read region shown in FIG. 5 will allow negative currents proportional to the charge stored, but increasing the reverse voltage beyond the read region will remove the positive charge and thus erase the stored information. Consequently in operation, the memory array is preferably operated with only positive voltages to write and read, a high voltage to write and a low voltage to read, and a high negative voltage to erase stored data, as shown in FIG. 5. However, if the polarity of the 'write' and 'erase' voltages are reversed, the 'read' voltage applied would then be negative as indicated by 'write,' 'read,' and 'erase' in parenthesis in FIG. 5.

Since the stored charge can be analog, the channel conductance can be varied continuously over a limited range. The memory array may thus provide analog control over the connection strength between X and Y conductors for use as a synaptic memory connection network in an electronic neural network.

Although preferred embodiments of the invention have been described and illustrated herein, it is recognized that modifications and variations may readily occur to those skilled in the art, particularly in the selection of materials. For example, in place of intrinsic silicon for the amorphous semiconductor material, the silicon may be doped lightly n or p, or may be replaced with some other semiconductor material, intrinsic or doped. Silicon is simply preferred, and it is amorphous only because it would be too impractical to fabricate with crystalline silicon in the conductive channel of the vertical porous floating gate MOSFETS. Consequently, it is intended that the claims be interpreted to cover all possible alternatives, even though they are not regarded as preferable or feasible at this time due to limitations of fabrication techniques as presently understood.

We claim:

1. An electrically programmable, erasable, read-only memory comprising at least one vertical porous floating gate MOSFET structure having a source and a drain electrode, said structure comprising a plurality of electrically insulated metallic particles embedded in an amorphous semiconductor body between said source electrode and said drain electrode, wherein the metallic particles are adjacent to but insulated from said source electrode, and insulation between said metallic particles and said semiconductor material is thick enough to prevent tunneling of electrons at a predetermined high voltage across said source and drain electrodes, said insulation between said particles and said source electrode being sufficiently thin to allow tunneling of electrons from said source electrode at said predetermined high voltage, whereby information may be stored in said memory device by application of voltage sufficient to produce tunneling of electrons, stored information may be read without erasing the stored information by application of a low voltage, lower than said predetermined high voltage, and information may be erased by application of a reverse voltage of sufficient amplitude to produce tunneling of electrons.

2. An electrically programmable, erasable, read-only memory as defined in claim 1 comprised of more than one vertical porous floating gate MOSFET structure in an array, wherein said source electrodes of MOSFET structures in said array are connected together in at least one group by at least one conductor and said drain electrodes of MOSFET structures in said array are connected to separate ones of a plurality of parallel conductors crossing over said one conductor, whereby each MOSFET structure in said array may be individually selected for storage, read-out and erasure of information by applications of voltages to selected ones of said conductors.

3. An electrically programmable, erasable, read-only memory as defined in claim 1 comprised of more than one porous floating gate MOSFET structure in a matrix wherein said source electrodes of MOSFET structures in said matrix array are connected together by a first array of parallel conductors and said drain electrodes of MOSFET structures in said matrix array are connected together by a second array of parallel conductors crossing over said first array of parallel conductors at an angle, whereby each MOSFET structure in said matrix array may be selected for storage, read-out and erasure of information by selective applications of voltages through selected ones of said first and second arrays of conductors.

4. An electrically programmable, erasable, read-only memory comprised of a layer of amorphous semiconductor material, a first array of parallel conductors on one side of said layer of amorphous semiconductor material, a second array of parallel conductors on the other side of said layer of semiconductor material oriented for each conductor of said second array to cross over all conductors of said first array of conductors at an angle, and a porous metallic floating gate embedded in said semiconductor material between crossing conductors of said first and second arrays of conductors, each floating gate between crossing conductors of said first array and said second array of conductors being comprised of metallic particles surrounded on all sides with an electrically insulating film, each of said metallic particles surrounded by a thin insulating film being separated from adjacent metallic particles and a conductor of said second array of conductors by semiconductor material, but not separated from a conductor of said first array of conductors by semiconductor material, the thickness of said electrically insulating film on all sides of each metallic particle, except next to a conductor of said first array of conductors, being sufficiently thick to prevent tunneling of electrons in response to a high voltage applied between selected conductors of said first and second arrays of conductors, and the thickness of said insulating material next to a conductor of said first array of conductors is sufficiently thin to allow tunneling of electrons in response to said high voltage in order to charge said floating gate particles upon application of said high voltage between selected conductors of said first and second arrays of conductors, thereby providing for storage of a charge in a porous metallic floating gate at selected crossings of conductors of said first and second arrays of conductors by application of voltages to selected conductors of said first and second array of conductors, whereby elements of information stored in said porous metallic gates may be nondistinctively read out upon selective application of a lower voltage between selected conductors of said first and second array of conductors, said lower voltage being insufficient to cause tunneling of electrons through insulating film adjacent to said first array of conductors, and information stored may be erased by application of a reverse voltage applied between selected conductors of said first and second arrays of conductors of an amplitude sufficient to cause tunneling of electrons out of said porous floating metallic gates for discharging any stored charge.

5. An array of vertical porous floating gate MOSFET memory elements comprised of a layer of semiconductor material, an array of parallel conductors on one side of said layer of semiconductor material, an array of parallel conductors on the side of said layer of semiconductor material opposite said one side oriented at an angle with respect to said array of parallel conductors on said one side, and an array of porous floating gates embedded in said layer of semiconductor material, one floating gate between each pair of crossing conductors of said first and second arrays of conductors, said floating gate at each location adjacent a conductor of one of said first and second arrays of conductors comprising an array of metal particles, each particle being insulated on all sides to a thickness sufficient to prevent tunneling of electrons upon application of a predetermined voltage except a side which is adjacent said conductor of said one of said first and second arrays of conductors, the insulation on said side adjacent said conductor being sufficiently thin to permit tunneling in response to an applied voltage greater than said predetermined voltage, thereby to charge said porous floating gate and thus store information proportional to the voltage applied, each insulated particle being surrounded by said semiconductor material in ohmic contact with the conductor to which said side of said particle is adjacent, thereby to permit reading out information stored by application of a low voltage less than said predetermined voltage, and said stored information may be erased by application of a reverse voltage sufficient to cause tunneling of electrons from said floating gate to said adjacent conductor.

6. A porous floating gate MOSFET structure comprised of a body of amorphous semiconductor material with a source conductor on one side of said body and a drain conductor on a side of said body directly opposite said one side, and a porous floating gate embedded in said semiconductor material, said porous floating gate being comprised of metallic particles electrically insulated from all sides, said insulated metallic particles adjacent said source conductor having electrical insulation separating said metallic particles from said source conductor sufficiently thin to permit electron tunneling therethrough in response to application of a voltage to said source and drain conductors across said amorphous semiconductor material greater than a predetermined threshold voltage, thereby to charge said porous floating gate to store an element of information, whereby conduction of current through said amorphous semiconductor material between said insulated metal particles is enhanced at a lower voltage applied to said source and drain conductors to read out said element of information without destroying said element of information until a reverse voltage is applied to said source and drain conductors greater than said predetermined threshold voltage.

7. A porous floating gate MOSFET structure comprised of a body of amorphous semiconductor material with a source conductor on one side of said body and a drain conductor on a side of said body directly opposite said one side, and a toroidal porous floating gate embedded in said semiconductor material, said porous floating gate being comprised of an electrically insulated metallic toroid adjacent said source conductor with electrical insulation between said metallic toroid and said source conductor sufficiently thin to permit electron tunneling therethrough in response to application of a voltage to said source and drain conductors across said amorphous semiconductor material greater than a predetermined threshold voltage, thereby to charge said porous floating gate to store an element of information, whereby conduction of current through said amorphous semiconductor material in the center of said insulated metallic toroid is enhanced at a lower voltage applied to said source and drain conductors to read out said element of information without destroying said element of information until a reverse voltage is applied to said source and drain conductors greater than said predetermined threshold voltage.

* * * * *